United States Patent
Lee et al.

(10) Patent No.: US 7,968,873 B2
(45) Date of Patent: Jun. 28, 2011

(54) ORGANIC LIGHT EMITTING DISPLAY AND MANUFACTURING METHOD THEREOF

(75) Inventors: Sang-Pil Lee, Anyang-si (KR); Chang-Woong Chu, Suwon-si (KR); Jin-Koo Chung, Suwon-si (KR); Chang-Mo Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 304 days.

(21) Appl. No.: 12/330,438

(22) Filed: Dec. 8, 2008

(65) Prior Publication Data

US 2010/0012928 A1 Jan. 21, 2010

(30) Foreign Application Priority Data

Jul. 16, 2008 (KR) .................. 10-2008-0069112

(51) Int. Cl.
H01L 29/08 (2006.01)

(52) U.S. Cl. .............. 257/40; 257/72; 257/99; 257/642; 257/759; 257/E39.007; 438/22; 438/34; 438/82; 313/498; 313/504

(58) Field of Classification Search ........................ None
See application file for complete search history.

(56) References Cited

U.S. PATENT DOCUMENTS

| | | | |
|---|---|---|---|
| 6,515,428 B1 * | 2/2003 | Yeh et al. | 315/169.3 |
| 2004/0183977 A1 * | 9/2004 | Kitagawa et al. | 349/141 |
| 2005/0184654 A1 * | 8/2005 | Kobayashi | 313/504 |
| 2005/0206309 A1 | 9/2005 | Shibasaki et al. | |
| 2006/0060865 A1 | 3/2006 | Cho et al. | |
| 2007/0096106 A1 | 5/2007 | Yamazaki et al. | |
| 2007/0164275 A1 * | 7/2007 | Ishiguro | 257/40 |

FOREIGN PATENT DOCUMENTS

| | | |
|---|---|---|
| JP | 2004335180 | 11/2004 |
| JP | 2005063927 | 3/2005 |
| JP | 2006011059 | 1/2006 |
| JP | 2006058751 | 3/2006 |
| JP | 2007188808 | 7/2007 |
| KR | 1020060018768 | 3/2006 |
| KR | 1020060026243 | 3/2006 |
| KR | 1020060059722 | 6/2006 |
| KR | 1020060067049 | 6/2006 |

* cited by examiner

Primary Examiner — Evan Pert
Assistant Examiner — Scott Wilson
(74) Attorney, Agent, or Firm — H.C. Park & Associates, PLC (57) ABSTRACT

The present invention relates to an organic light emitting device and a manufacturing method thereof. The organic light emitting device according to an exemplary embodiment of the present invention includes a first thin film transistor disposed on a substrate, an organic layer disposed on the first thin film transistor, a pixel electrode disposed on the organic layer and connected to the first thin film transistor, a partition disposed on the pixel electrode and the organic layer, and an organic emission layer disposed on the pixel electrode and contacting the partition. The partition has an organic layer exposing hole that exposes a portion of the organic layer and an opening that exposes a portion of the pixel electrode.

24 Claims, 6 Drawing Sheets

ORGANIC LIGHT EMITTING DISPLAY AND MANUFACTURING METHOD THEREOF

CROSS REFERENCE TO RELATED APPLICATION

This application claims priority from and the benefit of Korean Patent Application No. 10-2008-0069112, filed on Jul. 16, 2008, which is hereby incorporated by reference for all purposes as if fully set forth herein.

BACKGROUND OF THE INVENTION

1. Field of the Invention

The present invention relates to an organic light emitting device and a manufacturing method thereof.

2. Discussion of the Background

An organic light emitting device includes a plurality of pixels displaying one color of red, green, and blue. Each pixel includes an organic light emitting element for emitting light of one color among red, green, and blue, or an organic light emitting element for emitting white color and combining color filters for the colors red, green, and blue.

When using color filters, a step difference on the surface of the organic light emitting element is generated due to the color filters such that an organic layer for providing a flat surface is generally used. Also, an organic layer for defining a contact region between an anode or a cathode that is disposed on the organic layer, and an organic emission layer, may be further included in an organic light emitting device.

However, it is easy for the organic layer to be exposed to the air during the process for forming thin film structures thereon, or to absorb moisture by contact with an etchant or a cleaner. If moisture absorbed by the organic layer is transferred into the organic emission layer, the emissive capability of the organic emission layer may deteriorate such that the effective emission region may be reduced.

SUMMARY OF THE INVENTION

The present invention provides an organic light emitting device and a manufacturing method thereof, where moisture contained in an organic layer of the organic light emitting device may be effectively removed by forming an organic layer exposing hole and executing a moisture removal process.

Additional features of the invention will be set forth in the description which follows, and in part will be apparent from the description, or may be learned by practice of the invention.

The present invention discloses an organic light emitting device that includes a first thin film transistor disposed on a substrate, a color filter disposed on the first thin film transistor, an organic layer disposed on the color filter, a pixel electrode disposed on the organic layer and connected to the first thin film transistor, a partition disposed on the pixel electrode and the organic layer, the partition having an organic layer exposing hole that exposes a portion of the organic layer and an opening that exposes a portion of the pixel electrode, and an organic emission layer disposed on the pixel electrode and contacting the partition.

The present invention also discloses a method for manufacturing an organic light emitting device. The present invention includes forming a first thin film transistor on a substrate, forming a color filter on the thin film transistor, forming an organic layer on the color filter, forming a pixel electrode on the organic layer, forming a partition having an opening that exposes a portion of the pixel electrode and an organic layer exposing hole that exposes a portion of the organic layer, and forming an organic emission layer contacting the partition.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Organic light emitting devices according to exemplary embodiments of the present invention will be described below with reference to FIG. 1, FIG. 2, FIG. 3, FIG. 4, FIG. 5 and FIG. 6.

Figure 1:
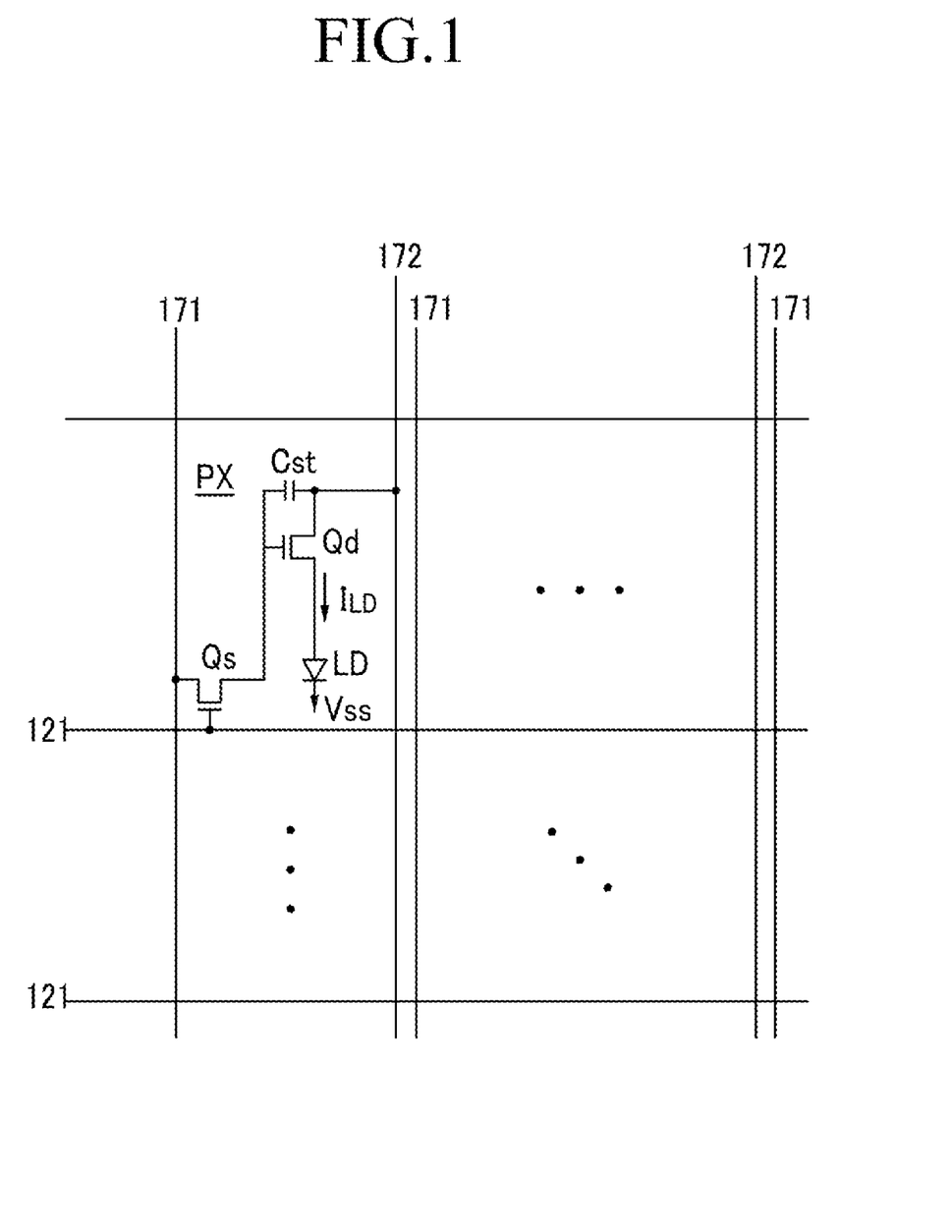
FIG. 1 is an equivalent circuit diagram of an organic light emitting device according to an exemplary embodiment of the present invention.

FIG. 1 is an equivalent circuit diagram of an organic light emitting device according to an exemplary embodiment of the present invention.

Referring to FIG. 1, an organic light emitting device according to the present exemplary embodiment includes a plurality of signal lines 121, 171, and 172, and a plurality of pixels PX connected thereto and arranged substantially in a matrix.

The signal lines include a plurality of gate lines 121 for transmitting gate signals (or scanning signals), a plurality of data lines 171 for transmitting data signals, and a plurality of driving voltage lines 172 for transmitting a driving voltage. The gate lines 121 extend substantially in a row direction and are substantially parallel to each other, and the data lines 171 and the driving voltage lines 172 extend substantially in a column direction and are substantially parallel to each other.

Each pixel PX includes a switching transistor Qs, a driving transistor Qd, a capacitor Cst, and an organic light emitting element LD.

The switching transistor Qs has a control terminal connected to one of the gate lines 121, an input terminal connected to one of the data lines 171, and an output terminal connected to the driving transistor Qd. The switching transistor Qs transmits a data signal received from the data line 171 to the driving transistor Qd in response to a gate signal received from the gate line 121.

The driving transistor Qd has a control terminal connected to the switching transistor Qs, an input terminal connected to the driving voltage line 172, and an output terminal connected to the organic light emitting element LD. The driving transistor Qd drives an output current $I_{LD}$ having a magnitude that depends on the voltage between the control terminal and the output terminal of the driving transistor Qd.

The capacitor Cst is connected between the control terminal and the input terminal of the driving transistor Qd. The capacitor Cst stores a data voltage applied to the control terminal of the driving transistor Qd and maintains it even after the switching transistor Qs turns off.

The organic light emitting element LD, which may be an organic light emitting diode (OLED), has an anode connected to the output terminal of the driving transistor Qd and a cathode connected to a common voltage Vss. The organic light emitting element LD emits light having an intensity that depends on an output current $I_{LD}$ of the driving transistor Qd, thereby displaying images.

The switching transistor Qs and the driving transistor Qd are n-channel field effect transistors (FETs), and at least one among them may have the structure shown in FIG. 1. However, at least one of the switching transistor Qs and the driving transistor Qd may be a p-channel FET. In addition, the connections among the transistors Qs and Qd, the capacitor Cst, and the organic light emitting diode LD may be modified.

Next, the detailed structure of the organic light emitting device shown in FIG. 1 will be described with reference to FIG. 2, FIG. 3, FIG. 4, FIG. 5, and FIG. 6 as well as FIG. 1.

Figure 2:
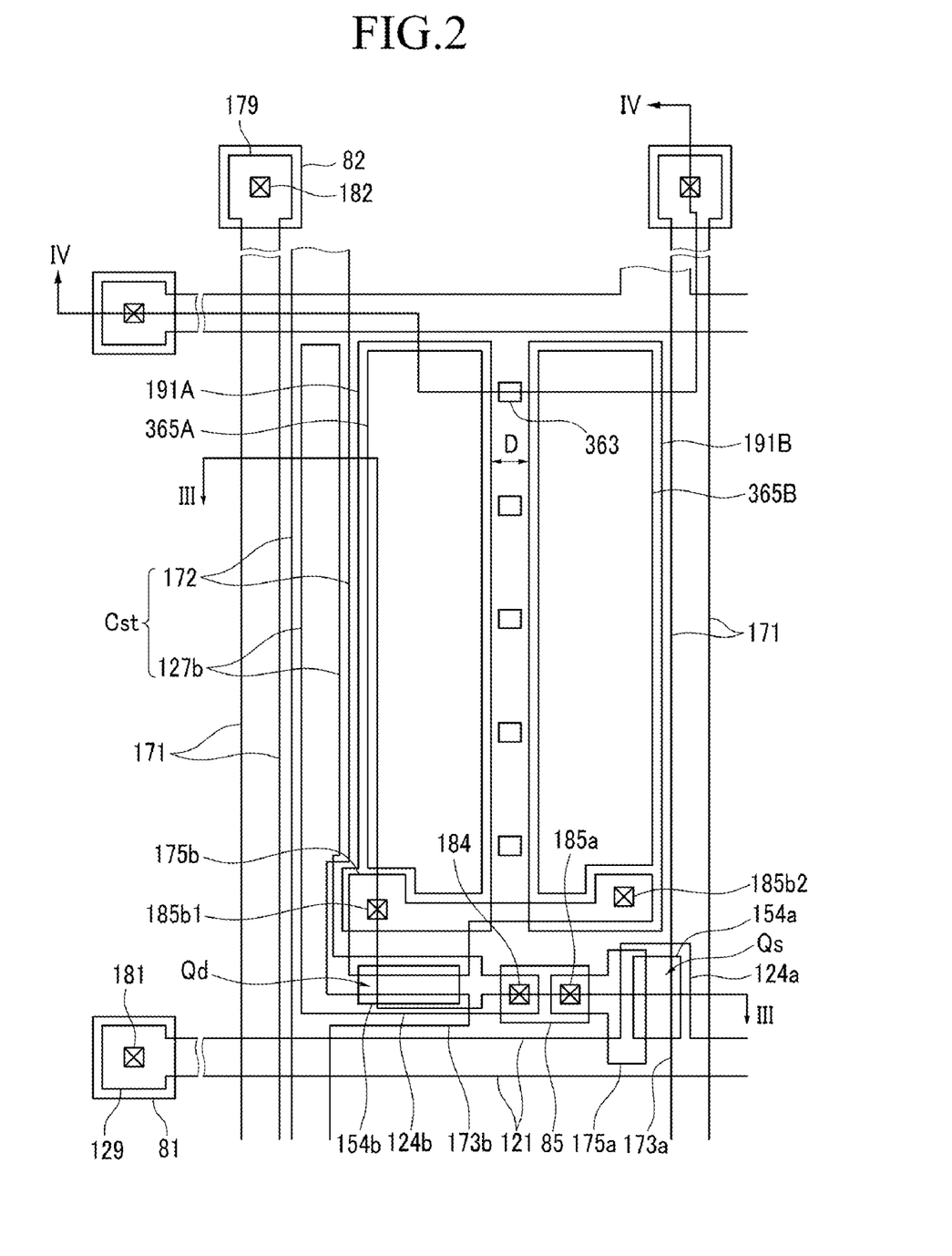
FIG. 2 is a layout view of an organic light emitting device according to an exemplary embodiment of the present invention.
Figure 3:
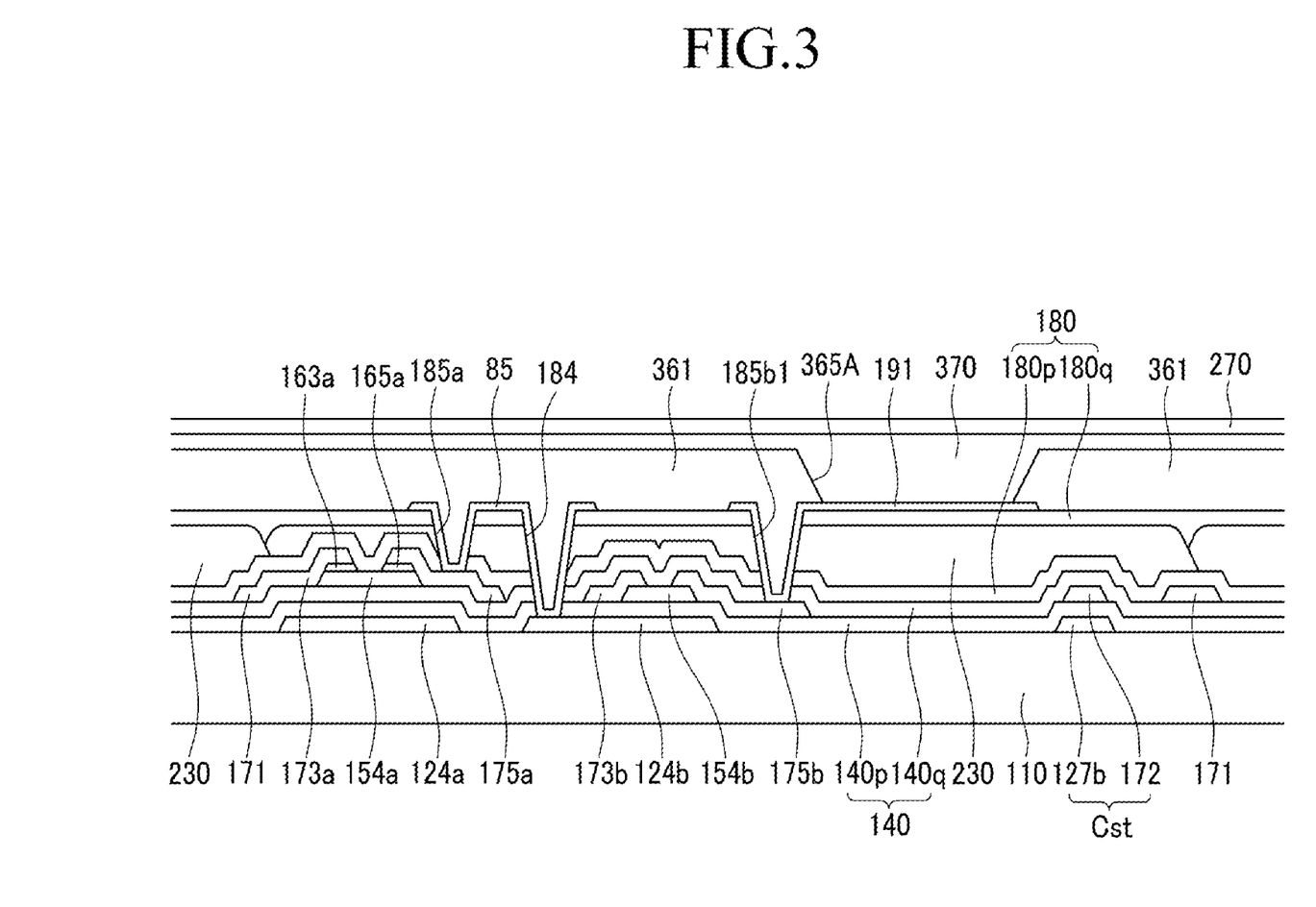
FIG. 3 is a cross-sectional view of the organic light emitting device taken along line III-III' of FIG. 2.
Figure 4:
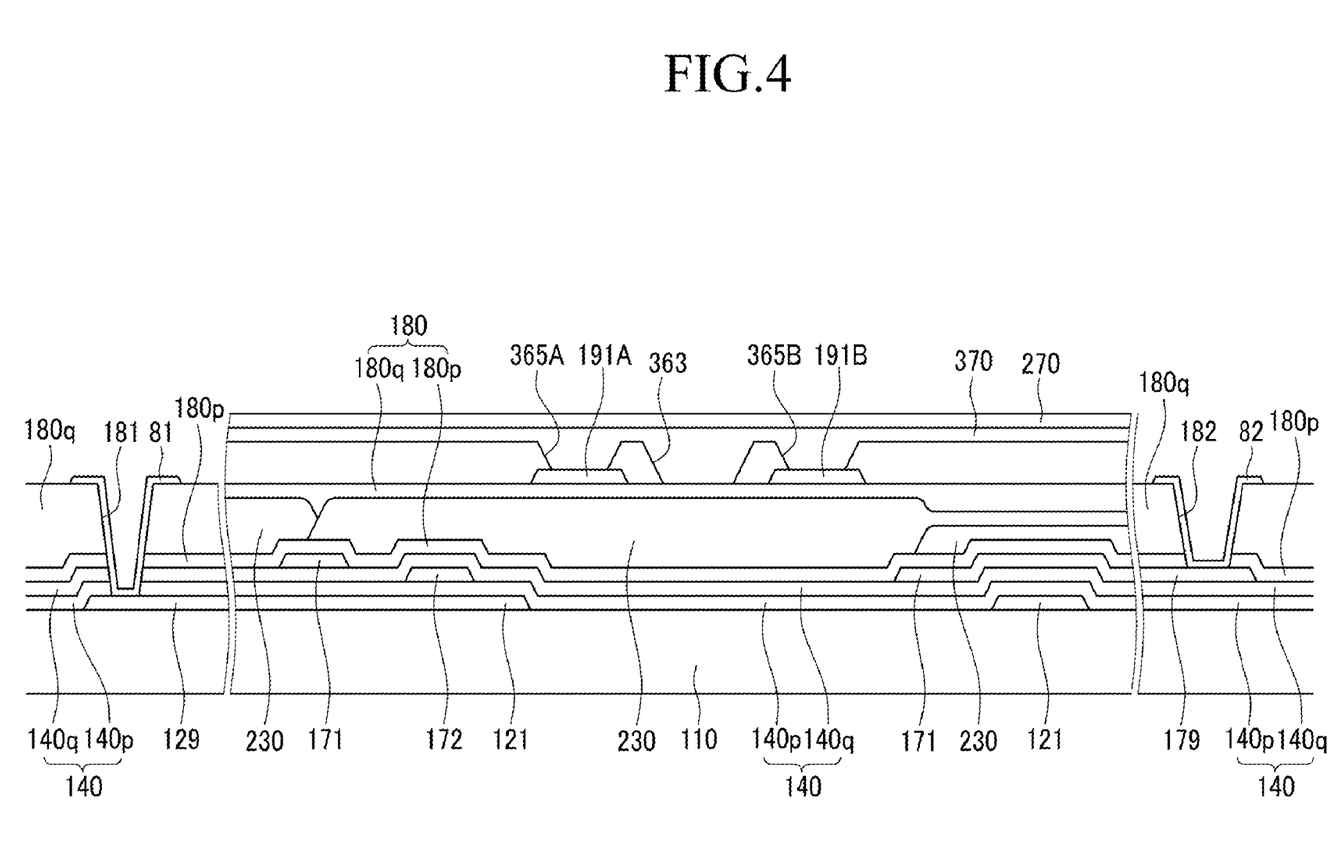
FIG. 4 is a cross-sectional view of the organic light emitting device taken along line IV-IV' of FIG. 2.
Figure 5:
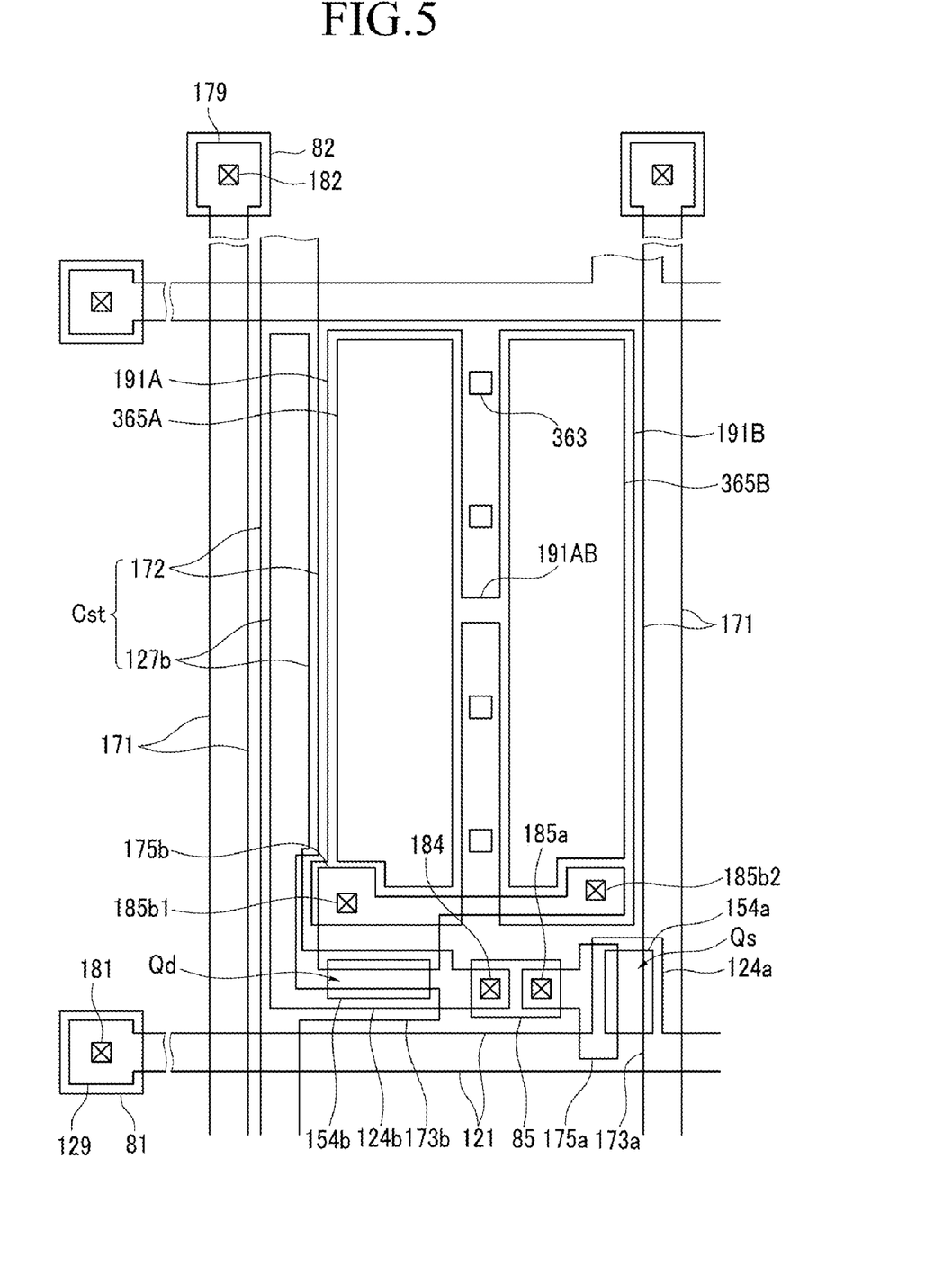
FIG. 5 and FIG. 6 are layout views of organic light emitting devices according to other exemplary embodiments of the present invention.
Figure 6:
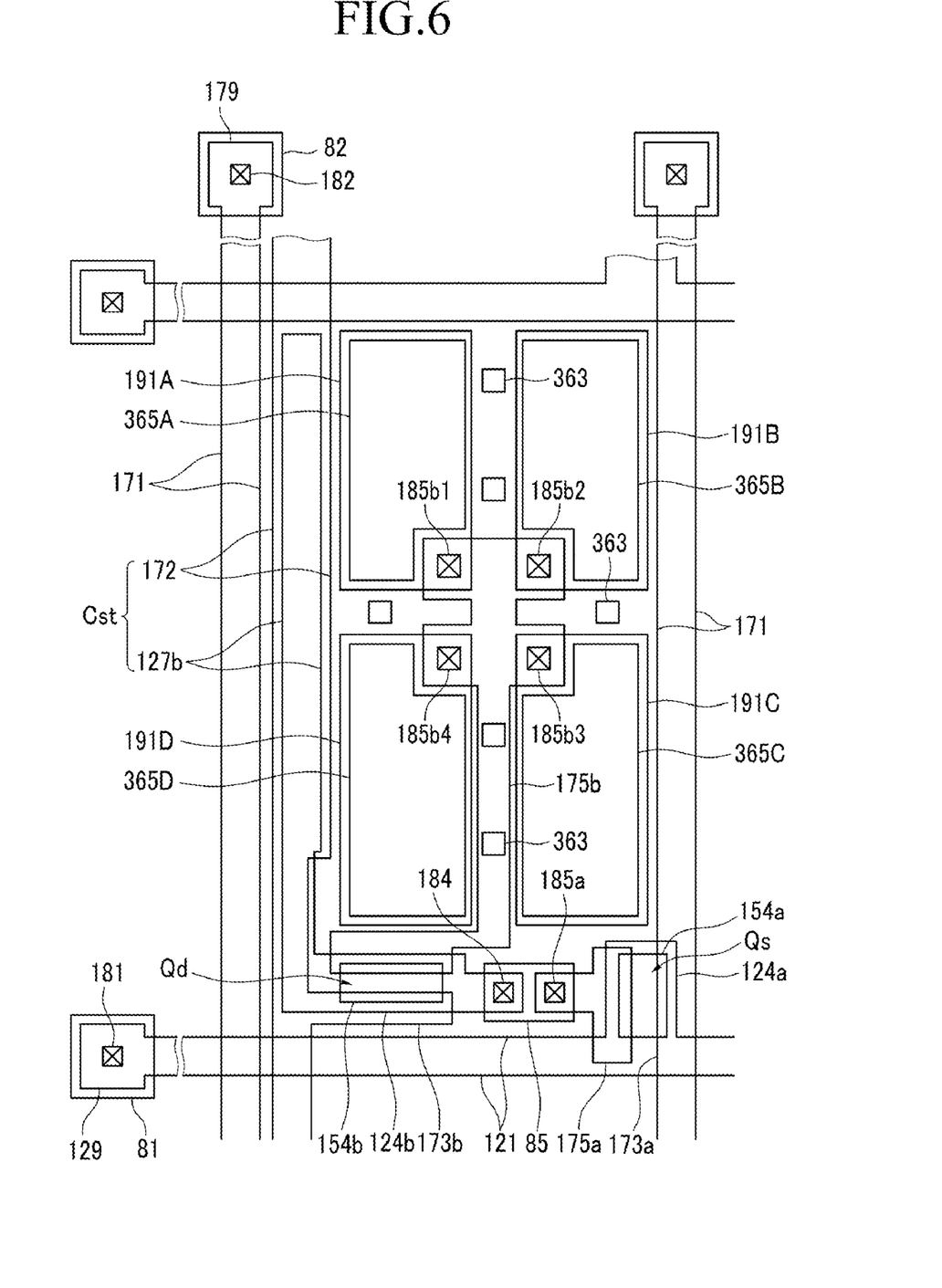

FIG. 2 is a layout view of an organic light emitting device according to an exemplary embodiment of the present invention, FIG. 3 is a cross-sectional view of the organic light emitting device taken along line III-III of FIG. 2, and FIG. 4 is a cross-sectional view of the organic light emitting device taken along line IV-IV of FIG. 2. FIG. 5 and FIG. 6 are layout views of organic light emitting devices according to other exemplary embodiments of the present invention.

The following description will focus on an organic light emitting device shown in FIG. 2, FIG. 3, and FIG. 4, and differences between organic light emitting devices shown in FIG. 5 and FIG. 6 and the device of FIG. 2, FIG. 3 and FIG. 4 will be made within the description of the device shown in FIG. 2, FIG. 3, and FIG. 4.

A gate line 121, a data line 171, a driving voltage line 172, a switching thin film transistor (switching TFT) Qs, a driving thin film transistor (driving TFT) Qd, a color filter 230, a pixel electrode 191, an organic emission layer 370, and a common electrode 270 are formed on an insulation substrate 110 that may be made of transparent glass or plastic.

The switching thin film transistor Qs includes a first control electrode 124a that is a part of the gate line 121, a first input electrode 173a that is a part of the data line 171, and a first output electrode 175a. The switching thin film transistor Qs further includes a first semiconductor island 154a disposed on the first control electrode 124a, and further includes ohmic contact islands 163a and 165a interposed between the first semiconductor island 154a, and the first input electrode 173a and the first output electrode 175a. The first semiconductor island 154a may be made of amorphous silicon, and the ohmic contacts 163a and 165a may be made of a material such as amorphous silicon in which an n-type impurity is highly doped.

The driving thin film transistor Qd includes a second control electrode 124b, a second input electrode 173b of the driving voltage line 172, and a second output electrode 175b. The second control electrode 124b includes a storage electrode 127b extending according to the driving voltage line 172 to form the storage capacitor Cst along with the driving voltage line 172. The driving thin film transistor Qd further includes a second semiconductor island 154b disposed on the second control electrode 124b. The second semiconductor island 154b may be made of polysilicon, and a portion of the second semiconductor island 154b that contacts the second input electrode 173b and the second output electrode 175b may be doped with an impurity.

The gate lines 121 and the first and second control electrodes 124a and 124b are disposed on the substrate 110, and a gate insulating layer 140 is formed thereon. The gate insulating layer 140 has a dual-layer structure including a lower layer 140p and an upper layer 140q, and the second semiconductor island 154b, the driving voltage line 172, the second input electrode 173b, and the second output electrode 175b are disposed between the lower layer 140p and the upper layer 140q. The first semiconductor island 154a, the ohmic contacts 163a and 165a, the data line 171, the first input electrode 173a, and the first output electrode 175a are disposed on the gate insulating layer 140.

A passivation layer 180 is formed on the gate lines 121, the data lines 171, driving voltage lines 172, the switching transistors Qd, and the driving transistors Qd. The passivation layer 180 has a dual-layer structure including an inorganic layer 180p and an organic layer 180q, and the color filter 230 is interposed between the inorganic layer 180p and the organic layer 180q. The inorganic layer 180p may be made of an inorganic material, so as not to damage the exposed portions of the first semiconductor island 154a. The organic layer 180q may be made of an organic material having good planarization characteristics, for example, a polyimide-based or a polyacryl-based organic material, which may reduce the step difference in the organic light emitting device due to the color filters 230.

The passivation layer 180 has a contact hole 182 exposing an end portion 179 of the data line 171, and the gate insulating layer 140 and the passivation layer 180 have a contact hole 181 exposing an end portion 129 of the gate line 121. The passivation layer 180 and the color filter 230 have a contact hole 185a exposing a portion of the first output electrode 175a, and the passivation layer 180, the color filter 230, and the gate insulating layer 140 have a contact hole 184 exposing a portion of the second control electrode 124b. Further, the passivation layer 180, the color filter 230, and the upper layer 140q of the gate insulating layer 140 may have contact holes 185b1, 185b2, 185b3, and 185b4 exposing the second output electrode 175b (see FIG. 2, FIG. 5, and FIG. 6).

As shown in FIG. 2, FIG. 5, and FIG. 6, the pixel electrode 191 is disposed on the passivation layer 180, and is connected to the second output electrode 175b of the driving transistor Qd through the contact holes 185b1, 185b2, 185b3, and 185b4. The pixel electrode 191 includes a plurality of electrode pieces 191A, 191B, 191C, and 191D. As shown in FIG. 2 and FIG. 6, the electrode pieces 191A, 191B, 191C, and 191D may be respectively connected to the second output electrode 175b of the driving transistor Qd, or connected to each other through a connection bridge 191AB as shown in FIG. 5. The electrode pieces 191A, 191B, 191C, and 191D are separated from each by a predetermined distance such that a portion of the organic layer 180q therebetween is exposed. In the examples shown in FIG. 2 and FIG. 6, the second output electrode 175b extends along the edge of the electrode pieces 191A, 191B, 191C, and 191D or the space therebetween, thereby decreasing a reduction of the aperture ratio.

Contact assistants 81 and 82 and a connecting member 85 are further disposed on the passivation layer 180, and these may be made of a transparent conductive material such as indium tin oxide (ITO) or indium zinc oxide (IZO), or a reflective metal such as aluminum, silver, chromium, or an alloy thereof.

The connecting member 85 connects the second control electrode 124b and the first output electrode 175 through the contact holes 184 and 185a. The contact assistants 81 and 82 are respectively connected to the end portions 129 and 179 of the gate lines 121 and the data lines 171 through the contact holes 181 and 182. The contact assistants 81 and 82 enhance the adhesion force between the end portions 129 and 179 and external devices, and protect them.

A partition 361 is formed on the passivation layer 180. The partition 361 surrounds the peripheries of the electrode pieces 191A, 191B, 191C, and 191D, to define openings 365A, 365B, 365C, and 365D (see FIG. 2, FIG. 5, and FIG. 6). The partition 361 may be made of an organic insulator such as polyimide-based or polyacryl-based organic material. The partition 361 has a plurality of organic layer exposing holes 363 that expose a portion of the organic layer 180q between the electrode pieces 191A, 191B, 191C, and 191D. Although shown in the drawings as a square, the organic layer exposing holes 363 may have various shapes provided they expose portions of the underlying organic layer 180q. The maximum width of the organic layer exposing hole 363 may be 10 μm or less.

The organic emission layer 370 is disposed inside the openings 365A, 365B, 365C, and 365D and on the partition 361. The organic emission layer 370 emits white light, and may have a deposition structure including a plurality of organic materials that emit light of the different primary colors red, green, and blue.

The organic emission layer 370 may have a multi-layered structure including an auxiliary layer (not shown) for improving light emitting efficiency, as well as a light emission layer (not shown) for emitting light. The auxiliary layer may include an electron transport layer (not shown) and a hole transport layer (not shown) for achieving a balance of electrons and holes, and an electron injection layer (not shown) and a hole injection layer (not shown) for reinforcing injection of electrons and holes.

A common electrode 270 is formed on the organic emission layer 370. The common electrode 270 receives a common voltage Vss and may be made of a reflective metal such as calcium (Ca), barium (Ba), magnesium (Mg), silver (Ag), aluminum (Al), their alloys, etc., or a transparent conductive material such as ITO, IZO, etc.

A pixel electrode 191, an organic light emitting member 370, and the common electrode 270 form an organic light emitting element LD. The pixel electrode 191 functions as an anode, and the common electrode 270 as a cathode, or vice versa.

In such an organic light emitting device, the organic layer 180q or the partition 361, which is made of an organic material, may include moisture. When the moisture is transferred into the organic emission layer 370, light emission is not properly generated such that the effective emission region may be reduced. Therefore, it is necessary to remove the moisture.

When manufacturing the organic light emitting device, the thin film transistors Qs and Qd, the inorganic layer 180p, and the color filters 230 are sequentially formed on the substrate 110, the organic layer 180q is formed on the color filters 230, and then, an annealing process may be executed in a vacuum state at a temperature of about 200-230° C. to remove the moisture existing in the organic layer 180q. However, when sputtering and wet-etching an ITO layer on the organic layer 180q to form pixel electrodes 191, moisture may be absorbed into the organic layer 180q again. Accordingly, the temperature in the sputtering chamber may be increased to about 200-230° C. to remove the moisture so that an additional annealing process would not be necessary. The sputtering temperature is conventionally about 100° C.

Also, after forming the partition 361, an annealing process may be executed in a vacuum annealing chamber at a temperature of about 200-230° C. to remove moisture from the partition 361 or the organic layer 180q that is made of an organic material. In this case, the moisture remaining in the organic layer 180q may be effectively discharged through the gap D between the electrode pieces 191A, 191B, 191C, and 191D and the organic layer exposing hole 363 formed in the partition 361.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting device, comprising:
   a first thin film transistor disposed on a substrate;
   an organic layer disposed on the first thin film transistor;
   a pixel electrode disposed on the organic layer and connected to the first thin film transistor;
   a partition disposed on the pixel electrode and the organic layer, the partition comprising an organic layer exposing hole that exposes a portion of the organic layer and an opening that exposes a portion of the pixel electrode; and
   an organic emission layer disposed on the pixel electrode and contacting the partition.

2. The organic light emitting device of claim 1, further comprising
   a color filter disposed between the first thin film transistor and the organic layer.

3. The organic light emitting device of claim 2, wherein
   the pixel electrode comprises at least two electrode pieces that are separated from each other via a gap that exposes a portion of the organic layer, and
   the organic layer exposing hole is disposed in the gap.

4. The organic light emitting device of claim 2, wherein
   the organic layer comprises a polyimide-based or a polyacryl-based organic material.

5. The organic light emitting device of claim 2, wherein
   the partition comprises an organic material.

6. The organic light emitting device of claim 5, wherein
   the partition comprises a polyimide-based or a polyacryl-based organic material.

7. The organic light emitting device of claim 2, further comprising
   an inorganic layer disposed between the color filter and the thin film transistor.

8. The organic light emitting device of claim 2, wherein a width of the organic layer exposing hole is 10 μm or less.

9. The organic light emitting device of claim 3, wherein the at least two electrode pieces are respectively connected to the first thin film transistor.

10. The organic light emitting device of claim 3, wherein the pixel electrode further comprises a connection bridge connecting the at least two electrode pieces.

11. The organic light emitting device of claim 2, wherein the pixel electrode comprises indium tin oxide or indium zinc oxide.

12. The organic light emitting device of claim 2, further comprising:
a second thin film transistor connected to the first thin film transistor;
a gate line connected to the second thin film transistor; and
a data line connected to the second thin film transistor.

13. A method for manufacturing an organic light emitting device, comprising:
forming a thin film transistor on a substrate;
forming an organic layer on the thin film transistor;
forming a pixel electrode on the organic layer;
forming a partition having an opening that exposes a portion of the pixel electrode and an organic layer exposing hole that exposes a portion of the organic layer; and
forming an organic emission layer contacting the partition.

14. The method of claim 13, further comprising forming a color filter between the thin film transistor and the organic layer.

15. The method of claim 14, wherein the pixel electrode comprises at least two electrode pieces.

16. The method of claim 14, further comprising performing an annealing process to remove moisture from the organic layer before forming the organic emission layer.

17. The method of claim 16, wherein the annealing process comprises annealing at a temperature of 200-230° C.

18. The method of claim 16, wherein the annealing process is performed after forming the partition.

19. The method of claim 16, wherein the annealing process is performed before forming the pixel electrode.

20. The method of claim 16, wherein forming the pixel electrode comprises sputtering indium tin oxide or indium zinc oxide in a sputtering chamber.

21. The method of claim 20, wherein the sputtering chamber has a temperature in a range of 200-230° C. when sputtering indium tin oxide or indium zinc oxide.

22. The method of claim 16, wherein the organic layer comprises a polyimide-based or a polyacryl-based organic material.

23. The method of claim 16, wherein the partition comprises a polyimide-based or a polyacryl-based organic material.

24. The method of claim 16, further comprising forming an inorganic layer on the thin film transistor the color filter being disposed on the inorganic layer.

* * * * *